PLURAL-TRANSISTOR CIRCUIT WITH FUSE MEANS
Filed Jan. 15, 1959
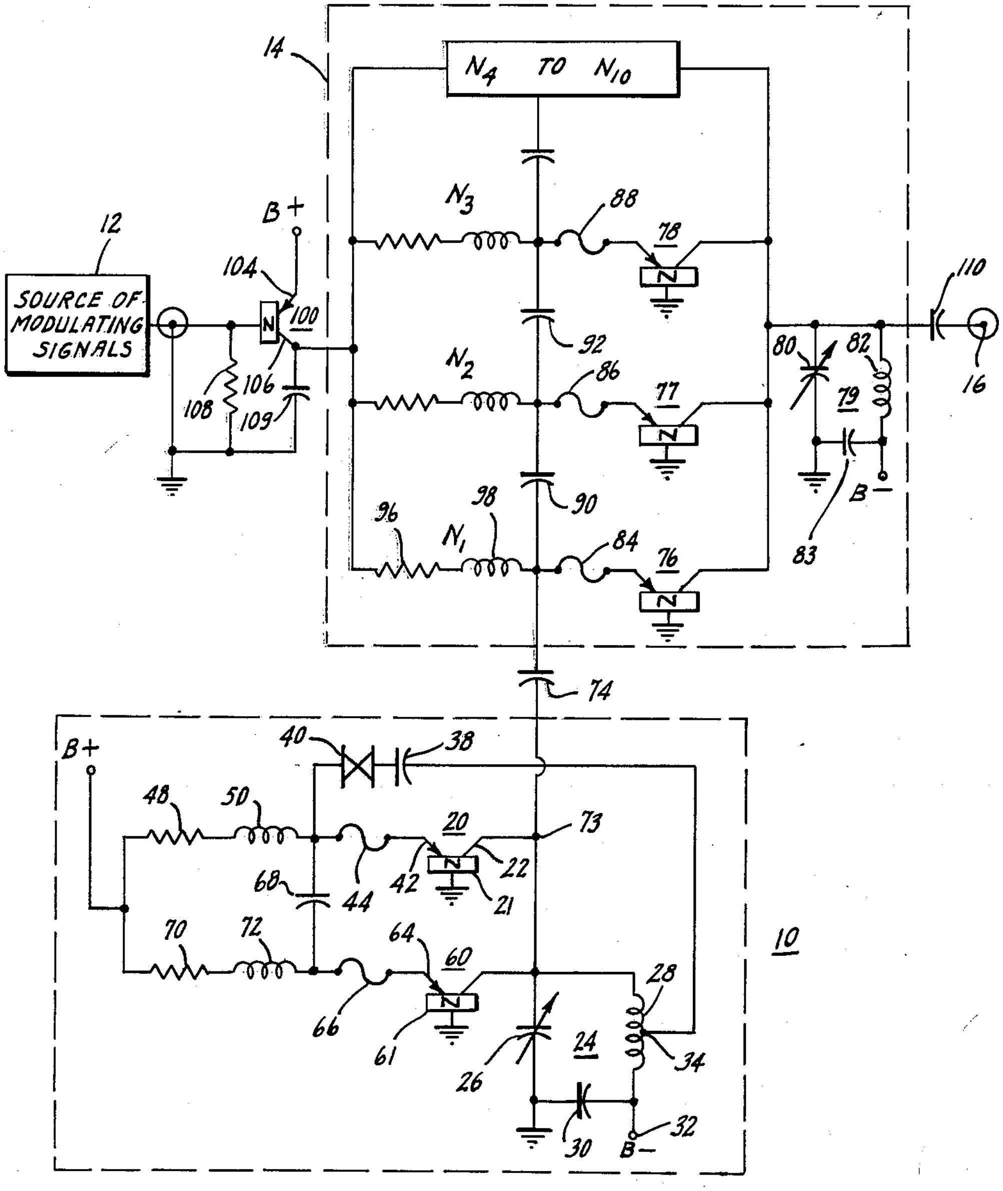
INVENTORS
STEPHEN SLENKER
WALTER C. KINZINGER
BY
Albert L. Free
AGENT United States Patent Office 3,022,465

Patented Feb. 20, 1962

3,022,465

PLURAL-TRANSISTOR CIRCUIT WITH FUSE MEANS

Stephen Slenker, Bristol, Tenn., and Walter C. Kinzinger, Malden, Mass., assignors, by mesne assignments, to Philco Corporation, Philadelphia, Pa., a corporation of Delaware Filed Jan. 15, 1959, Ser. No. 786,948

3 Claims. (Cl. 330—30)

The invention relates to plural transistor signal-translating circuits and particularly to such circuits in which plural transistor stages are connected effectively in parallel for the purpose of providing increased power output at high frequencies.

In many applications, for example in transmitters utilizing transistors as the active elements for providing signal power, the useful power output obtainable at high frequencies from a single transistor is less than is desired in the particular application. This is usually for the reason that to provide operation at high frequencies requires the use of very small transistor dimensions such that the necessary power dissipation cannot be provided without damage to the transistor. We have found that this limitation may be overcome by connecting a plurality of transistor circuits effectively in parallel, each transistor being operable at the necessary high frequency and contributing its proportionate share to the necessary signal power. However, when such transistors are so connected the probabilities of a failure in one of them during operation is proportionally increased. Since this failure, particularly in the case of high frequency transistors, is commonly by short-circuiting of the emitter to the collector element of the transistor, the result is to produce a severe drop in the amount of D.-C. current available for the remaining transistors, to severely load the input signal source common to all of the transistors and/or to load severely the output circuit to which all of the transistors supply power. The problem of input and output loading is particularly severe where the output circuit is a high Q resonant circuit as is commonly the case at the higher frequencies with which the invention is primarily concerned. Accordingly, in such circuits the failure of one of the transistors by an emitter-to-collector short circuit will not only prevent operation of the defective transistor stage but will also prevent satisfactory operation of the other stages and of the entire parallel-connected circuit.

Accordingly it is an object of our invention to provide an improved plural-transistor signal-translating circuit.

Another object is to provide a plural-transistor circuit utilizing parallel-connected transistor stages in which operation is continued despite emitter-collector short circuiting of less than all of the transistors.

A still further object is to provide a plural-transistor signal transmitter operable at high frequencies and high power output which will remain operative despite failure of less than all of the transistors therein.

It is a further object to provide a reliable plural-transistor oscillator circuit which will remain operative despite failure of less than all of its parallel-connected transistors.

A still further object is to provide a plural-transistor modulator circuit capable of continued operation after emitter-to-collector failure of less than all of the transistors thereof.

The above objectives are achieved in accordance with the invention by the provision of a transistor circuit comprising a plurality of common-base transistor stages connected effectively in parallel with each other, supplied with input signals from a common source at their emitter elements and having a common load circuit connected to their several collector elements. Preferably the common load circuit is of the resonant type. Appropriate direct bias potentials are also applied to the emitter and collector elements so that a substantial difference in D.-C. potential normally exists between the emitter and collector elements of each transistor. In accordance with the invention there are further employed a plurality of current-responsive electrical fuses distributed one in series in each of said parallel-connected stages between said source of input signals and said emitter elements.

The general operation of the circuit is then as follows. When all of the transistors are in their normal operative condition signals are translated from the common supply source to the common load impedance in normal manner. However, upon the occurrence of an emitter-collector short circuit in any one of the transistors the emitter-to-collector current rises abruptly to a large value sufficient to blow the associated fuse and to open-circuit the emitter element of the transistor which has failed. Because the emitter element has thus been open-circuited no drain is produced by the short-circuit upon the direct-current biasing supply source and the current available for operating the other transistors is therefore in no way reduced by the failure. Furthermore the open-circuiting of the emitter element prevents any additional deleterious loading of the common signal source so that appropriate signals are still supplied to the input of the remaining transistors. In addition, the common load circuit for the transistors is not unduly loaded nor is its resonant frequency substantially varied, since the collector element of the transistor which has failed still remains in its original connection to the load circuit, appearing merely as a reverse-biased diode, and the operating conditions of the output circuit are therefore not substantially modified. Accordingly the parallel-connected transistor stages may operate at substantially the same frequency as before failure of one of their members.

Other objects and features of the invention will become more readily apparent from a consideration of the following detailed description taken in conjunction with the accompanying drawing which is a schematic diagram of an electrical circuit embodying the invention.

The invention will be described with particular reference to apparatus for generating a modulated carrier-wave signal of high frequency, and hence comprises in general a transistor oscillator circuit 10 for generating the carrier wave oscillations, a source of modulating signals 12 and a modulator circuit 14 in which modulation of the carrier-wave oscillation by the modulating signal is accomplished and from which the desired signals are supplied to output terminal 16, which may be connected to an antenna for radiation of the modulated carrier-wave signal. In this apparatus the inventive concept is embodied both in the oscillator circuit and in the modulator circuit although in somewhat different forms.

More particularly in the exemplary form of the invention shown in detail in the figure, oscillator 10 comprises a transistor 20 here designated as being of the N-type, the base 21 being connected to a source of reference potential designated as ground. Between the collector element 22 of transistor 20 and the source of reference potential there is connected a resonant tank circuit 24 consisting of an adjustable capacitor 26 effectively in parallel with an inductor 28 and a capacitor 30 having a low reactance at the resonant frequency of capacitor 26 and inductance 28 and serving primarily as a bypass for the collector voltage supply which supplies an appropriate negative potential to collector 22 from terminal 32 by way of inductor 28. A feedback connection is also provided from tap 34 on inductor 28 to the emitter circuit of transistor 20 by way of blocking capacitor 38 and a frequency-determining piezo-electric crystal 40. In addition there is provided between the latter crystal and the emitter element 42 of transistor 20 a current-responsive electrical fuse 44 of such a character as to complete the feedback connection to the emitter element under normal operating conditions but to open and disconnect the emitter element in response to the high currents produced when an emitter-to-collector short-circuit occurs in transistor 20. Bias for the emitter element 42 of transistor 20 is supplied from a terminal marked B+ by way of resistor 48, inductor 50 and fuse 44. Resistor 48 serves primarily to stabilize the biasing of transistor 20 while inductor 50 serves as a choke coil to isolate the portion of the circuit operating at high frequencies from the bias supply circuit, as will become more apparent hereinafter.

In addition oscillator 20 employs a second transistor 60 which is connected effectively in parallel with transistor 20. Thus the base 61 of transistor 60 is connected to the same source of reference potential as is transistor 20, while the collector of transistor 60 is directly connected to the collector of transistor 20. Emitter 64 of transistor 60 is connected to one terminal of an electrical fuse 66 which may be substantially identical with fuse 44, the other terminal of fuse 64 being supplied with feedback signals substantially identical with those applied to fuse 44, by way of coupling capacitor 68. Emitter bias for transistor 60 is supplied from the common emitter-bias source B+ by way of the series combination of resistor 70 and inductor 72, each of which may be substantially identical with their counterparts 48 and 50 respectively in the emitter circuit of transistor 20.

In operation the transistors and the values of the various circuit components are selected so that continuous oscillations at the desired frequency are produced. Thus the values of capacitor 26 and inductor 28 are selected, in view of the shunt capacities of the collector elements of transistors 20 and 60, so as to produce resonance at the desired oscillation frequency, which is also the frequency of series resonance of crystal 40. Operating conditions such as the biases supplied to the transistors and the position of the tap 34 are adjusted so that the amount of feedback is sufficient to provide the necessary sustained oscillations. Resistors 48 and 70 are made as small as is compatible with their function of preventing diversion of the emitter biasing current principally to a single one of the two transistors 20 and 60 to the detriment of the operation of the other of the transistors.

As mentioned hereinbefore, the fuses 44 and 66 are chosen so as to provide a closed circuit during normal operation of the two transistors 20 and 60, and preferably have as low a value of resistance under this condition as is practicable. However, should an emitter-to-collector short-circuit occur in one of the transistors, such as transistor 20 for example, there will flow through fuse 44 a current which is substantially equal to the sum of the emitter supply voltage B+ and the collector supply voltage B−, divided by the value of the series resistor 48, which current is sufficiently high to burn out fuse 44 and provide an open circuit at emitter 42. With fuse 44 opened, transistor 60 is still supplied with emitter and collector biases and with feedback signals which permit it to continue to operate as an oscillator, and the resonant frequency and Q of the tank circuit 24 remain substantially the same since the collector element of disabled transistor 20 is still connected to the high-potential side of the tank circuit and the capacity which it provides is substantially unchanged. For these reasons oscillator 10 will continue to operate at substantially the same frequency at which it operated when both transistors 20 and 60 were functioning properly and will provide useful output signals at the common collector connection 73 of the two transistors.

The output signal from oscillator 10 is supplied by way of coupling capacitor 74 to the modulator 14, which comprises ten parallel-connected transistor circuits, three of which designated $N_1$, $N_2$ and $N_3$ are shown in full while the remainder $N_4$ to $N_{10}$ are shown only in block form since they may be substantially identical with circuits $N_1$, $N_2$ and $N_3$. Considering in detail the nature of the circuits $N_1$, $N_2$ and $N_3$, there are employed therein three transistors 76, 77 and 78 each having its base element connected to a common source of reference potential designated as ground. Between the collector element of each of these transistors and the base element thereof is connected a common tank circuit 79 comprising variable capacitor 80 effectively in parallel with inductor 82. As in the case of resonant circuit 24, a bypass capacitor 83 is connected between ground and the source of collector supply potential B− from which collector potential is supplied to all of the transistors 76, 77 and 78 by way of inductor 82. Connected to the emitter elements of transistors 76, 77 and 78 are fuses 84, 86 and 88 respectively, the terminals of these fuses which are remote from their respective emitter elements being supplied with continuous oscillations from oscillator 10 by way of the coupling capacitors 74, 90, and 92 respectively. The terminals of fuses 84, 86 and 88 remote from their associated emitter elements are also supplied with appropriate emitter biases by way of separate resistor-inductor series circuits which serve substantially the same functions as the corresponding elements in oscillator 10 and may have similar or identical values. For example bias for the emitter element of transistor 76 is supplied by way of resistor 96 and inductor 98 from the collector element of a driving transistor 100.

Transistor 100, which may be of N-conductivity type, is connected in the common-collector circuit configuration and is responsive to modulating signals from source 12 to apply the modulating signals with appropriate strength to the emitter elements of each of the parallel-connected transistors of the modulator 14. A base resistor 108 and an oscillation-frequency by-pass capacitor 109 connected to the collector of transistor 100 are employed in conventional manner to provide this operation. The modulating signals from source 12 may be sinusoidal, pulsiform or of other nature and are applied between the base and collector elements of the driver transistor 100. Because of the substantial conductance existing between the emitter element 104 of transistor 100 to which positive bias is supplied from the source designated as B+, positive bias is also produced at the collector element 106 thereof and is supplied to the emitter elements of transistors of modulator 14 as mentioned hereinbefore.

In normal operation each parallel-connected stage $N_1$–$N_{10}$ of the modulator 14 is supplied with the continuous-wave oscillations from oscillator 10 at that terminal of the associated fuse which is remote from the emitter element of the associated transistor. Simultaneously, modulating signals from source 12 are supplied by way of driver transistor 100 to vary the emitter biases of the latter transistors. As a result in normal operation there is developed across the common load circuit 79, and supplied to output terminal 16 by way of coupling capacitor 110, a continuous-wave oscillation modulated by the modulating signals generated in source 12. It is understood that the load circuit 79 will ordinarily be tuned to substantially the same frequency as the load circuit in oscillator 10.

If an emitter-to-collector short circuit should occur in one of the transistors of modulator 14 the associated fuse element will blow and provide an open-circuit at the emitter element of that particular transistor. As will be apparent from the foregoing description of the operation of the transistor circuits in oscillator 10, opening of the fuse will prevent a serious drain on the D.-C. supply source as well as undue loading of both the oscillation signal source and the common output circuit 79. Accordingly if any one of the transistors of modulator 14 should fail by an emitter-to-collector short circuit the other nine transistors will continue to operate, producing an output signal about $\frac{9}{10}$ as strong as that originally existing as compared to the little or no signal which would be produced in prior art systems in like circumstances.

Furthermore operation of the complete transmitter will continue despite failure of any of the parallel-connected transistors in either the oscillator or modulator sections thereof, and despite the fact that all of the transistors in the oscillator and modulator sections have a common bias source, a common input signal source and a common output load. The oscillator 10 and the modulator 14 will in fact continue to operate so long as each contains one transistor which is operative.

In addition location of the fuses in the emitter circuits of the various transistors permits operation at high powers and high frequencies with a high-Q resonant collector circuit, which operation would not be possible if the fuse elements were instead connected to the collector elements of the transistors. This is for the reason that the impedance levels and Q's of the emitter circuits of the several transistors are relatively low, due primarily to the low input resistance of transistors, and hence the circulating currents through the fuses are normally relatively small. However the collector impedances of transistors are relatively high and the collector capacities thereof constitute a substantial portion of the total capacity in parallel with the output load inductance. For this reason a substantial portion of the circulating A.-C. current of the high-Q output circuit flows through each collector and, if the fuses were located in series with the collectors, the circulating currents through the fuses would exceed by a large amount the direct currents through them and make it impracticable to provide the desired reliable opening of the fuses in response to predetermined values of direct current.

Without intending thereby to limit the invention, the following specific values employed in one particular embodiment of the invention are given in the interest of complete definiteness:

| | |
|---|---|
| Transistors 20, 60, 76, 77, 78 etc | Micro-alloy diffused transistors (MADT). |
| Fuses 44, 66, 84, 86, 88 etc | $\frac{1}{32}$ ampere fuses, resistance of 100 ohms or less for low currents. |
| Inductors 50, 72, 98 etc | 40 turns of No. 40 copper wire, $\frac{1}{8}''$ diam., $\frac{1}{2}''$ long. |
| Capacitors 26 and 80 | 1–18 micromicrofarads. |
| Inductor 28 | $3\frac{1}{4}$ turns No. 22 copper wire $\frac{3}{16}''$ diam., $\frac{5}{8}''$ long. |
| Inductor 82 | 5 turns of No. 22 copper wire, $\frac{3}{16}''$ diam., $\frac{5}{8}''$ long. |
| Resistors 48, 70, 96 etc | 120 ohms. |
| Capacitors 30, 38, 90, 92 etc | 800 micromicrofarads. |
| Capacitor 70 | 8.2 micromicrofarads. |
| Capacitor 110 | 15 micromicrofarads. |
| Crystal 40 | Series resonant at 108 megacycles per second. |
| Normal emitter current in transistors of oscillator 10 and modulator 14 | About 12.5 ma. average, about 25 ma. peak. |
| Emitter current of transistors of oscillator 10 and modulator 14 when transistor is short-circuited | About 100 ma. |
| Transistor 100 | 2N240 surface-barrier transistor (SBT). |
| Capacitor 109 | 2000 micromicrofarads. |
| Resistor 108 | 3900 ohms. |
| B− supply voltage | −12 volts. |
| B+ voltage for oscillator 10 | Plus 1.5 volts. |
| B+ voltage for transistor 100 | 3 volts. |

While the invention has been described with particular reference to preferred embodiments thereof it will be understood that it can be embodied in many forms widely different from that specifically described. Accordingly the invention is to be limited only by the scope of the appended claims.

We claim:

1. A plural transistor signal-translating circuit for high-frequency signals comprising: a first common-base signal-translating stage comprising a first transistor having base, collector and emitter electrodes and an associated collector capacity; a second common-base signal-translating stage comprising a second transistor also having emitter, collector and base electrodes and an associated collector capacity; a common source of collector supply potential for said collector electrodes of said first and second transistors; first and second means for connecting said collector electrodes of said first and second transistors respectively to said common source of supply potential; a common source of emitter bias; third and fourth connecting means for connecting said emitter electrodes of said first and second transistors respectively to said last-named common source; a common signal-input circuit resonant at substantially said high frequency and connected to said emitter electrodes of said first and second transistors; a common collector load impedance for said first and second transistors, said load impedance and the combined collector capacities of said first and second transistors forming a circuit combination resonant at substantially said high frequency, said frequency being sufficiently high that said combined collector capacities constitute a substantial fraction of the total capacity of said resonant circuit combination; first fuse means connected between said emitter electrode of said first transistor and each of said common source of emitter bias and said common input circuit, said first fuse means being characterized by an initially low resistance for current of a normal operating intensity supplied to said last-named emitter electrode and by acquiring a substantially higher resistance when said current rises above a predetermined first intensity, said first and third connecting means having a combined resistance sufficiently low to produce a current through said first fuse means in excess of said first predetermined intensity when said emitter electrode of said first transistor is substantially short-circuited to said collector electrode thereof; and second fuse means connected between said emitter electrode of said second transitor and each of said common source of emitter bias and said common input circuit, said second fuse means being characterized by an initially low resistance for current of a normal operating intensity supplied to said emitter electrode of said second transistor and by acquiring a substantially higher resistance when said last-named current rises above a predetermined second intensity greater than said last-named normal intensity, said second and said fourth connecting means having a combined resistance sufficiently low to produce a current through said second fuse means which is in excess of said second predetermined intensity when said emitter electrode of said second transistor is substantially short-circuited to said collector electrode thereof.

2. A signal-translating circuit in accordance with claim 1 in which said source of collector supply potential and said common collector load impedance are connected directly to said collector electrodes of said first and second transistors by connections of substantially zero resistance.

3. A signal-translating circuit in accordance with claim 1 comprising a first series combination of a resistive element and an inductive element connected between said source of emitter bias and the terminal of said first fuse means remote from said emitter electrode of said first transistor, and a second series combination of a resistive element and an inductive element connected between said source of emitter bias and the terminal of said second fuse means remote from said emitter electrode of said second transistor, said input circuit being connected to supply signals to a point in said signal-translating circuit between said first series combination and said remote terminal of said first fuse means and to a point between said second series combination and said remote terminal of said second fuse means.

References Cited in the file of this patent

UNITED STATES PATENTS

| | | |
|---|---|---|
| 1,798,660 | Davis | Mar. 31, 1931 |
| 1,933,707 | Colvin | Nov. 7, 1933 |
| 2,222,784 | Schierl | Nov. 26, 1940 |
| 2,806,964 | Spades | Sept. 17, 1957 |
| 2,846,526 | Moore | Aug. 5, 1958 |
| 2,875,284 | Ehret | Feb. 24, 1959 |

FOREIGN PATENTS

| | | |
|---|---|---|
| 537,206 | Germany | Jan. 26, 1956 |